(12) United States Patent
Chou et al.

(10) Patent No.: US 10,615,370 B2
(45) Date of Patent: Apr. 7, 2020

(54) LIGHT-EMITTING DISPLAY PANEL

(71) Applicant: InnoLux Corporation, Miao-Li County (TW)

(72) Inventors: Cheng-Hsu Chou, Miao-Li County (TW); Yi-Xin Yang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/278,324

(22) Filed: Feb. 18, 2019

(65) Prior Publication Data

US 2019/0181379 A1    Jun. 13, 2019

Related U.S. Application Data

(63) Continuation of application No. 15/709,514, filed on Sep. 20, 2017, now Pat. No. 10,249,844.

(30) Foreign Application Priority Data

Sep. 30, 2016   (CN) .......................... 2016 1 0868100

(51) Int. Cl.
  *H01L 51/52*   (2006.01)
  *H01L 33/56*   (2010.01)
  (Continued)

(52) U.S. Cl.
  CPC .......... *H01L 51/5253* (2013.01); *H01L 33/56* (2013.01); *H01L 51/5246* (2013.01); *H01L 27/156* (2013.01); *H01L 27/3246* (2013.01)

(58) Field of Classification Search
  CPC . H01L 51/5253; H01L 51/5246; H01L 33/56; H01L 27/3246; H01L 27/156
  See application file for complete search history.

(56) References Cited

U.S. PATENT DOCUMENTS 9,450,034 B2   9/2016   Lee et al.
9,705,107 B2   7/2017   Kim et al.
(Continued)

FOREIGN PATENT DOCUMENTS

| CN | 103985817 A | 8/2014 |
| CN | 104517999 A | 4/2015 |
| CN | 105428389 A | 3/2016 |

OTHER PUBLICATIONS

Chinese language office action dated Sep. 27, 2019, issued in application No. CN 201610868100.5.

*Primary Examiner* — Nathan W Ha
(74) *Attorney, Agent, or Firm* — McClure, Qualey & Rodack, LLP (57) ABSTRACT

A light-emitting display panel is provided. The light-emitting display panel includes a substrate. The substrate includes a display area and a peripheral area surrounding the display area. A light-emitting display structure is disposed on the display area. A first section wall is disposed on the peripheral area. The first section wall surrounds the light-emitting display structure. An enclosed wall is disposed on the peripheral area. The enclosed wall surrounds the first section wall. The enclosed wall is positioned outside the first section wall. A first inorganic material layer covers the light-emitting display structure. The first inorganic material layer covers the top surface of the array substrate outside the enclosed wall.

11 Claims, 8 Drawing Sheets

(51) Int. Cl.
*H01L 27/15* (2006.01)
*H01L 27/32* (2006.01)

(56) References Cited

U.S. PATENT DOCUMENTS

| | | | |
|---|---|---|---|
| 9,853,241 B2 | 12/2017 | Bi et al. | |
| 9,865,842 B2* | 1/2018 | Song | H01L 51/5246 |
| 9,871,081 B2* | 1/2018 | Kim | H01L 27/3258 |
| 9,882,168 B2* | 1/2018 | Kato | H01L 27/1248 |
| 2014/0117316 A1* | 5/2014 | Choi | H01L 51/5253 |
| | | | 257/40 |
| 2014/0217397 A1* | 8/2014 | Kwak | H01L 27/1218 |
| | | | 257/43 |
| 2014/0225071 A1* | 8/2014 | Park | H01L 51/5203 |
| | | | 257/40 |
| 2015/0060786 A1* | 3/2015 | Kwak | H01L 51/5253 |
| | | | 257/40 |
| 2015/0091030 A1* | 4/2015 | Lee | H01L 27/3246 |
| | | | 257/91 |
| 2016/0043345 A1* | 2/2016 | Goden | H01L 27/326 |
| | | | 257/40 |
| 2016/0064691 A1* | 3/2016 | Lee | H01L 27/3248 |
| | | | 257/40 |
| 2016/0072099 A1* | 3/2016 | Okamoto | H01L 51/5253 |
| | | | 257/40 |
| 2016/0190503 A1* | 6/2016 | Chang | H01L 51/5253 |
| | | | 257/40 |
| 2016/0284770 A1* | 9/2016 | Kim | H01L 27/3258 |
| 2016/0336541 A1* | 11/2016 | Kim | H01L 51/5253 |
| 2016/0365395 A1* | 12/2016 | Xu | H01L 51/5246 |
| 2016/0365398 A1* | 12/2016 | Kim | H01L 27/3258 |
| 2017/0018735 A1* | 1/2017 | Shiobara | H01L 51/5253 |
| 2017/0033312 A1* | 2/2017 | Kim | H01L 51/5253 |
| 2017/0053973 A1 | 2/2017 | Park et al. | |
| 2017/0069873 A1 | 3/2017 | Kim et al. | |
| 2017/0346036 A1 | 11/2017 | Kim | |
| 2018/0138451 A1 | 5/2018 | Kim | |

* cited by examiner

LIGHT-EMITTING DISPLAY PANEL

CROSS REFERENCE TO RELATED APPLICATIONS

This application is a continuation of application Ser. No. 15/709,514, filed on Sep. 20, 2017, now U.S. Pat. No. 10,249,844, which claims the priority of Chinese Application No. 201610868100.5, filed on Sep. 30, 2016, the entirety of which is incorporated by reference herein.

BACKGROUND OF THE DISCLOSURE

Field of the Disclosure

The present disclosure relates to a light-emitting display panel, and in particular provides a light-emitting display panel with a blocking wall in a peripheral area of the light-emitting display panel.

Description of the Related Art

Light-emitting panels (LED panels) have been widely applied in display devices of various products. LED panels have advantages of self-luminescence, high brightness, wide viewing-angle, high response speed, and simple processing. However, LED panels can easily become damaged by the penetration of moisture and harmful gases, such as oxygen. The lifetime of LED panels is hard to improve upon.

Thus, a novel LED panel, which can effectively prevent moisture and oxygen from permeating therein, is desirable.

BRIEF SUMMARY OF THE DISCLOSURE

A light-emitting display panel is provided. An exemplary embodiment of a light-emitting display panel includes a substrate comprising a display area and a peripheral area surrounding the display area. A light-emitting display structure is disposed on the display area. A first section wall is disposed on the peripheral area and surrounding the light-emitting display structure. An enclosed wall is disposed in the peripheral area. The enclosed wall surrounds the first section wall and is positioned outside the first section wall. A first inorganic material layer covers the light-emitting display structure. The first inorganic material layer covers the top surface of the array substrate outside the enclosed wall.

Another exemplary embodiment of a light-emitting display panel includes a substrate comprising a display area and a peripheral area surrounding the display area. A light-emitting display structure is disposed on the display area. A first section wall is disposed on the peripheral area and surrounding the light-emitting display structure. An enclosed wall is disposed on the peripheral area. The enclosed wall surrounds the first section wall and is positioned outside the first section wall. The height of the enclosed wall is lower than the height of the first section wall. A first inorganic material layer covers the display area of the substrate, the first section wall and the enclosed wall.

Yet another exemplary embodiment of a light-emitting display panel includes a substrate comprising a display area and a peripheral area surrounding the display area. A light-emitting display structure is disposed on the display area. A section wall is disposed on the peripheral area and surrounding the light-emitting display structure. An enclosed wall is disposed in the peripheral area. The enclosed wall surrounds the first section wall and is positioned outside the section wall. A first inorganic material layer is in contact with the substrate, the section wall, the enclosed wall and the top surface of the substrate between the section wall and the enclosed wall.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

The following description is of an embodiment of carrying out the disclosure. This description is made for the purpose of illustrating the general principles of the disclosure and should not be taken in a limiting sense. The scope of the disclosure is determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Embodiments provide a light-emitting display panel encapsulated by thin film encapsulation (TFE) technology. The light-emitting display panel uses at least one row consisting of a section wall and at least one row consisting of an enclosed wall surrounding a light-emitting display structure within a display area. The light-emitting display structure is encapsulated by inorganic material encapsulation layers and an organic material encapsulation layer alternatively arranged with the inorganic material encapsulation layers. During the thin film encapsulation (TFE), the section wall may allow the residual organic packaging material flowing through gaps of the section wall to the space between the section wall and the close line wall and being completely blocked by the close line wall without overflowing to a region outside the enclosed wall. Therefore, the light-emitting display panel in accordance with some embodiments of the disclosure is fully encapsulated by the inorganic material encapsulation layers. The inorganic material encapsulation layers can effectively prevent moisture and oxygen from penetrating into the light-emitting display structure from outside and the top surface of the light-emitting display panel. In addition, the section wall and the enclosed wall made of organic materials may serve as buffer layers of the inorganic material encapsulation layers. The buffer layers are used to prevent the inorganic material encapsulation layers suffering cracking and peeling while the array substrate is deformed. Furthermore, the section wall may be applied in the applications of flexible light-emitting display panels. The section wall helps to release the stress while the array substrate is deformed. When the array substrate is deformed, the section wall prevents the blocking wall suffering cracking, so that the moisture and oxygen are avoided penetrating into the light-emitting display structure from the outside environment.

Figure 1:
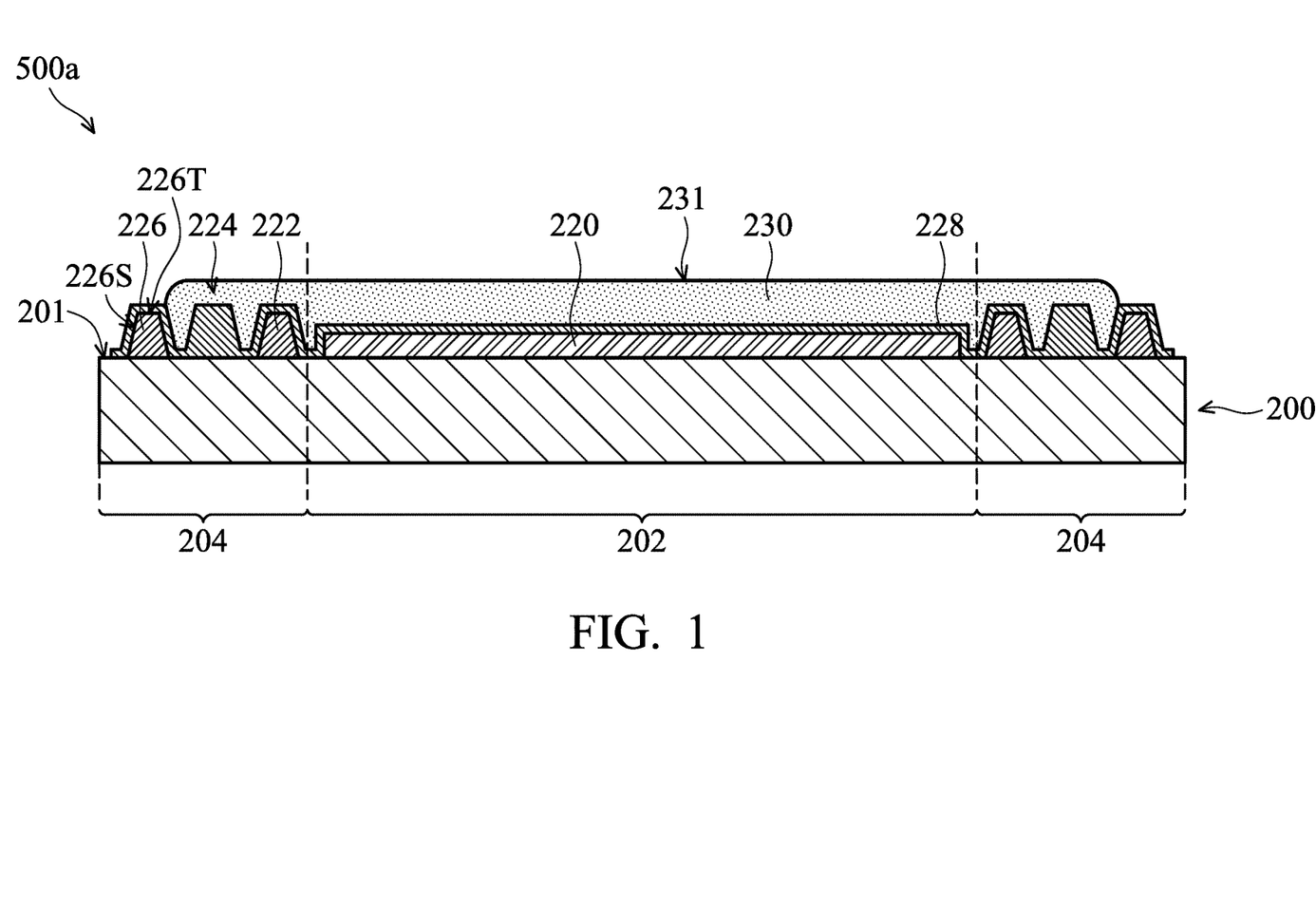
FIG. 1 is a cross-sectional view of a light-emitting display panel in accordance with some embodiments of the disclosure.
Figure 6:
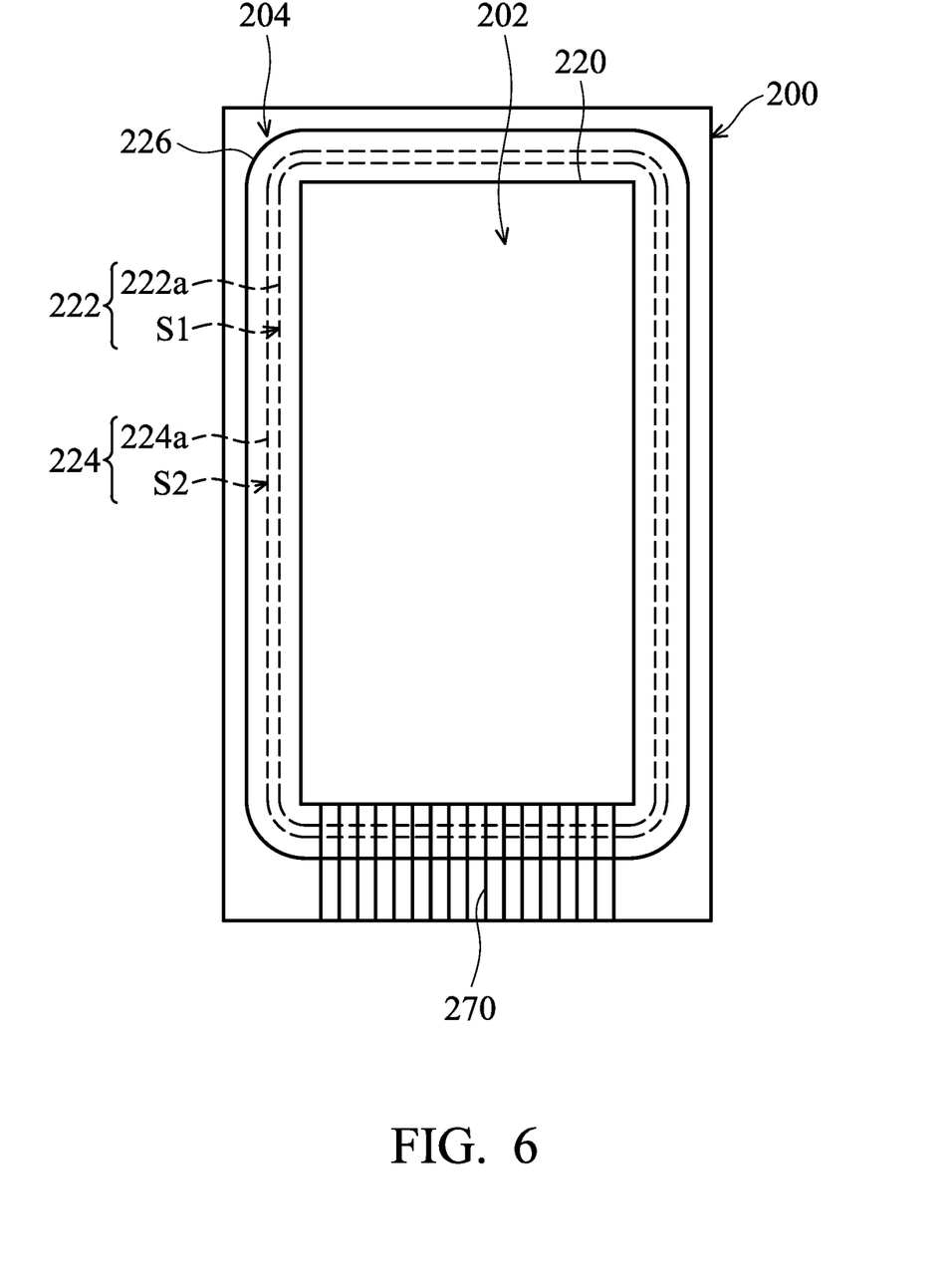
FIG. 6 is a top view of a light-emitting display panel in accordance with some embodiments of the disclosure.

FIG. 1 is a cross-sectional view of a light-emitting display panel in accordance with some embodiments of the disclosure. FIG. 6 is a top view of the light-emitting display panel in accordance with some embodiments of the disclosure. Please refer to FIG. 1 and FIG. 6, an array substrate 200 includes a display area 202 and a peripheral area 204 surrounding the display area 202. A light-emitting display panel 500a includes the array substrate 200, a light-emitting display structure 220, a first section wall 222, an enclosed wall 226 and a first inorganic material layer 228. The light-emitting display structure 220, the first section wall 222, the enclosed wall 226 and the first inorganic material layer 228 are disposed on a top surface 201 of the array substrate 200. FIG. 6 illustrates the arrangement of the light-emitting display structure 220, the first section wall 222 and the enclosed wall 226. The organic material layers and inorganic material encapsulation layers are not shown in FIG. 6 for brevity.

Figure 4:
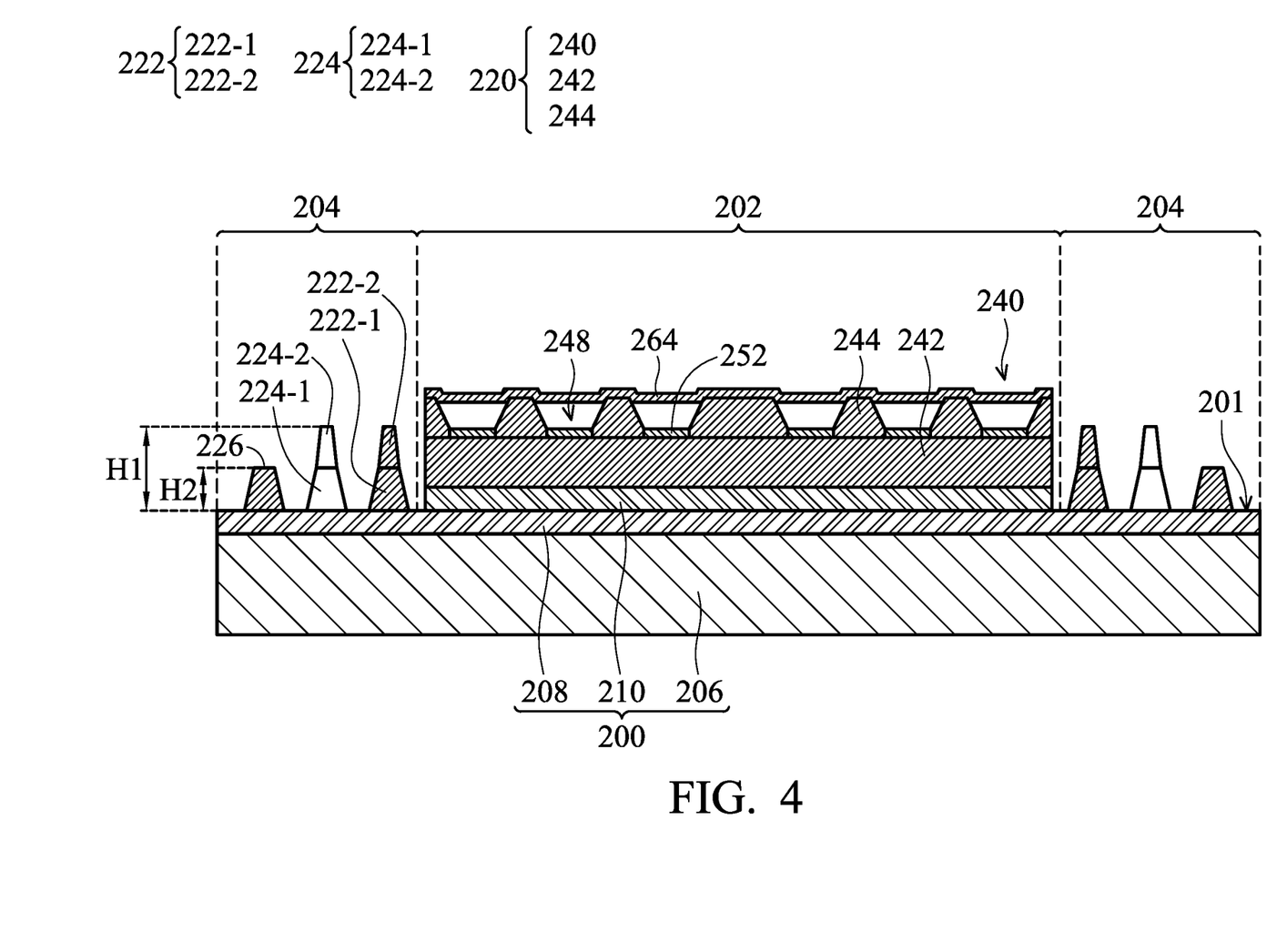
FIG. 4 is a cross-sectional view showing some elements of FIGS. 1-3.

FIG. 4 is a cross-sectional view showing some elements of FIG. 1. FIG. 4 illustrates the arrangement of the light-emitting display structure, the section wall and the enclosed wall. The organic material layers and inorganic material encapsulation layers are not shown in FIG. 4 for brevity. As shown in FIG. 4, in some embodiments, the array substrate 200 may include a substrate 206, a barrier layer 208 conformably covering the substrate 206, and a thin film transistor (TFT) layer 210 disposed on the barrier layer 208 within the display area 202. The substrate 206 may include a rigid substrate, such as a glass substrate, or a flexible substrate, such as a plastic substrate, but the disclosure is not limited thereto. In some embodiments, the top surface 201 of the array substrate 200 in the peripheral area 204 indicates the top surface of the barrier layer 208. In some embodiments, the barrier layer 208 may include inorganic materials, such as silicon nitride ($SiN_x$), silicon dioxide ($SiO_2$), oxynitride ($SiNO_x$), aluminum oxide ($Al_2O_3$), diamond-like carbon (DLC) or a combination thereof, but the disclosure is not limited thereto.

Please refer to FIG. 1, FIG. 4 and FIG. 6. The light-emitting display structure 220 is disposed on the display area 202 of the array substrate 200. The light-emitting display structure 220 is positioned on and electrically connected to the TFT layer 210. As shown in FIG. 4, the light-emitting display structure 220 may include light-emitting diodes 240, a first pixel defining layer 242 and a second pixel defining layer 244. The first pixel defining layer 242 and the second pixel defining layer 244 are disposed on the TFT layer 210 in sequence. In some embodiments, each of the light-emitting diodes 240 may serve as a sub-pixel device. The first pixel defining layer 242 and the second pixel defining layer 244 may be formed of organic photoresists.

Figure 5:
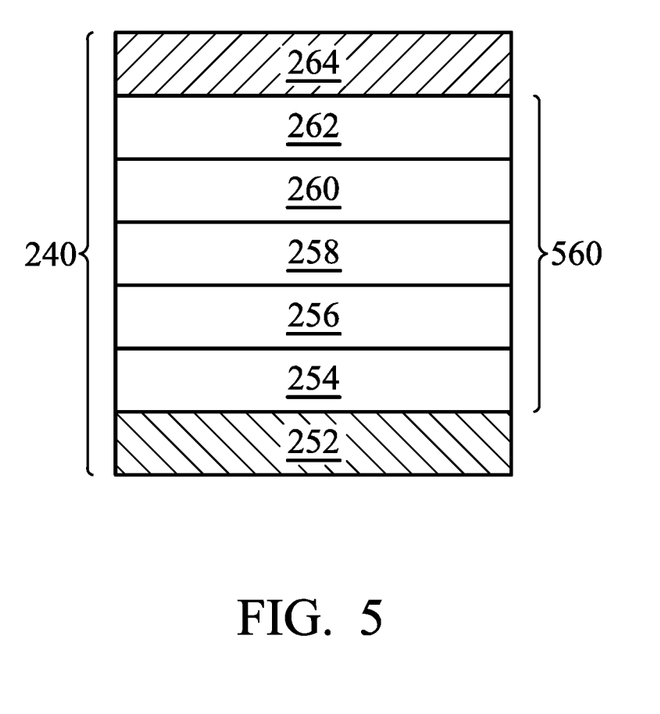
FIG. 5 is a cross-sectional view showing some elements of FIGS. 1-3.

FIG. 5 is a detailed illustration of the construction of the light-emitting diode 240. As shown in FIGS. 4 and 5, the light-emitting diode 240 may include a top-emission type light-emitting diode or a bottom-emission diode type light-emitting diode. The light-emitting diode 240 may include a first electrode 252, a second electrode 264 and a light-emitting layer 560 between the first electrode 252 and the second electrode 264. The light-emitting layer 560 may be a signal-layered light-emitting layer 258, or may be a lamination structure. FIG. 5 illustrates that the light-emitting layer 560 includes a lamination structure. The lamination structure may include a hole injection layer (HIL) 254, a hole transport layer (HTL) 256, a light-emitting layer (EML) 258, an electron transport layer (ETL) 260 and an electron injection layer (EIL) 262, which are laminated in sequence substantially along a direction perpendicular to the top surface 201 of the substrate 200. The light-emitting diode 240 may be electrically connected to the TFT 210 through the first electrode 252. In addition, the first electrode 252 of the light-emitting diode 240 may be formed on the top surface of the first pixel defining layer 242. The second electrode 264 may be disposed covering the top surface of the second pixel defining layer 244. In some embodiments, the first electrode 252 may be an anode formed of transparent conductive materials, such as indium tin oxide (ITO). The second electrode 264 may be a cathode formed of metal materials. As shown in FIG. 4, the hole injection layer 254, the hole transport layer 256, the light-emitting layer 258, the electron transport layer 260 and the electron injection layer 262 may be disposed within the opening 248 of the second pixel defining layer 244.

Figure 7:
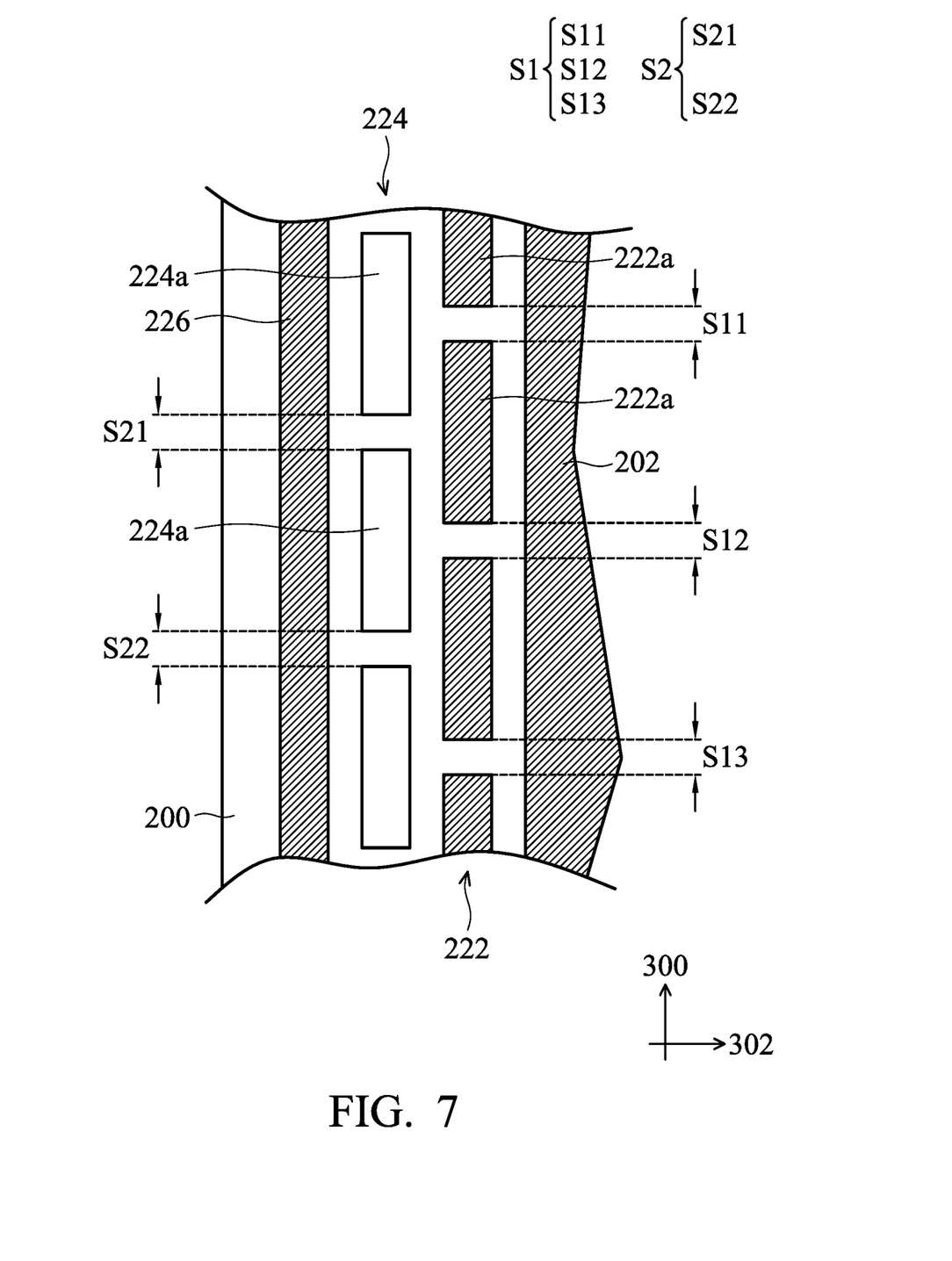
FIG. 7 is an enlarged view showing some elements of FIG. 6.

Please refer to FIG. 1, FIG. 4, FIG. 6 and FIG. 7. FIG. 7 is an enlarged view showing some elements of FIG. 6. FIG. 7 illustrates the arrangement of the first section wall 222 and the enclosed wall 226. The first section wall 222 and the enclosed wall 226 of the light-emitting display panel 500a are disposed in the peripheral area 204 of the array substrate 200. The first section wall 222 and the enclosed wall 226 are positioned outside the light-emitting display structure 220 and surround the light-emitting display structure 220. The enclosed wall 226 is disposed outside the first section wall 222 and surrounds the first section wall 222. The first section wall 222 and the enclosed wall 226 are substantially along a direction parallel to the top surface 201 of the substrate 200 and separated from each other by a distance. Therefore, a portion of the top surface 201 of the array substrate 200 in the peripheral area 204 is exposed from the first section wall 222 and the enclosed wall 226. In a top view shown in FIG. 6, the enclosed wall 226 may be closed-circular shape to completely surround the display area 202. Also, the first section wall 222 may be dash-circular shape to completely surround the display area 202. The first section wall 222 may be arranged substantially parallel to the enclosed wall 226. In some embodiments, the first section wall 222 has a height H1, and the enclosed wall 226 has a height H2. For example, the height H1 of the first section wall 222 may be in a range of about 3 μm to about 20 μm. The height H2 of the enclosed wall 226 may be in a range of about 0.5 μm to about 3 μm, for example. In some embodiments, the height H2 of the enclosed wall 226 is lower than the height H1 of the first section wall 222. For example, the height H2 of the enclosed wall 226 may be 20%-60% of the height H1 of the first section wall 222. For example, the height H2 of the enclosed wall 226 may be lower than or equal to half of the height H1 of the first section wall 222. For example, the height H2 of the enclosed wall 226 may be 30%-50% of the height H1 of the first section wall 222. In some embodiments, the first section wall 222 and the enclosed wall 226 may be formed of organic photoresists. The first pixel defining layer 242, the second pixel defining layer 244, the first section wall 222 and the enclosed wall 226 may be formed of the same material.

As shown in FIG. 7, in some embodiments, the first section wall 222 may include a plurality of first blocking sections 222a, the first blocking sections 222a are arranged substantially along the first direction 300 and separated from each other by a first gap S1.

As shown in FIG. 1, FIG. 4, FIG. 6 and FIG. 7, in some embodiments, the light-emitting display panel 500a further includes a second section wall 224 close to the first section wall 222. The second section wall 224 is arranged in the peripheral area 204 of the array substrate 200. The second section wall 224 surrounds the first section wall 222. Also, the second section wall 224 is positioned substantially parallel to the top surface 201 of the substrate 200 and between first section wall 222 and the enclosed wall 226. In the top view shown in FIG. 6, the second section wall 224 may have a dash-line ring shape to completely surround the display area 202. Also, the second section wall 224 may be arranged substantially parallel to the first section wall 222 and/or the enclosed wall 226. In some embodiments, the second section wall 224 and the first section wall 222 may be formed of the same material, such as organic photoresists. In additional, the second section wall 224, the first pixel defining layer 242 and the second pixel defining layer 244 may be formed of the same material.

As shown in FIG. 7, in some embodiments, the second section wall 224 may include a plurality of second blocking sections 224a. The second blocking sections 224a are arranged substantially along the first direction 300 and separated from each other by a second gap S2. In some embodiments, the first gap S1 and the second gap S2 are respectively positioned on different straight lines, which are substantially along a second direction 302. The second direction 302 is perpendicular to the first direction 300. More specifically, the first spacing and the closest second gap are arranged on different straight lines, which are substantially along the second direction 302. In some embodiments, the first gap S1 and the second gap S2 have an alternate arrangement along the first direction 300. For example, FIG. 7 illustrates the first gap including S11, S12, S13, and the second gap including S21, S22. To the first gap S12, the closest second gap is the second gap S21, S22. The first gap S12 and the second gap S21 are arranged on different straight lines substantially along the second direction 302. The first gap S12 and the second gap S22 are arranged on different straight lines, which are substantially along the second direction 302. That is, the first gap S1 is not aligned to and the closest second gap S2 along the second direction 302. In other words, the first gap S1 and the second gap S2 are alternatively arranged substantially along the second direction 302.

Figure 8:
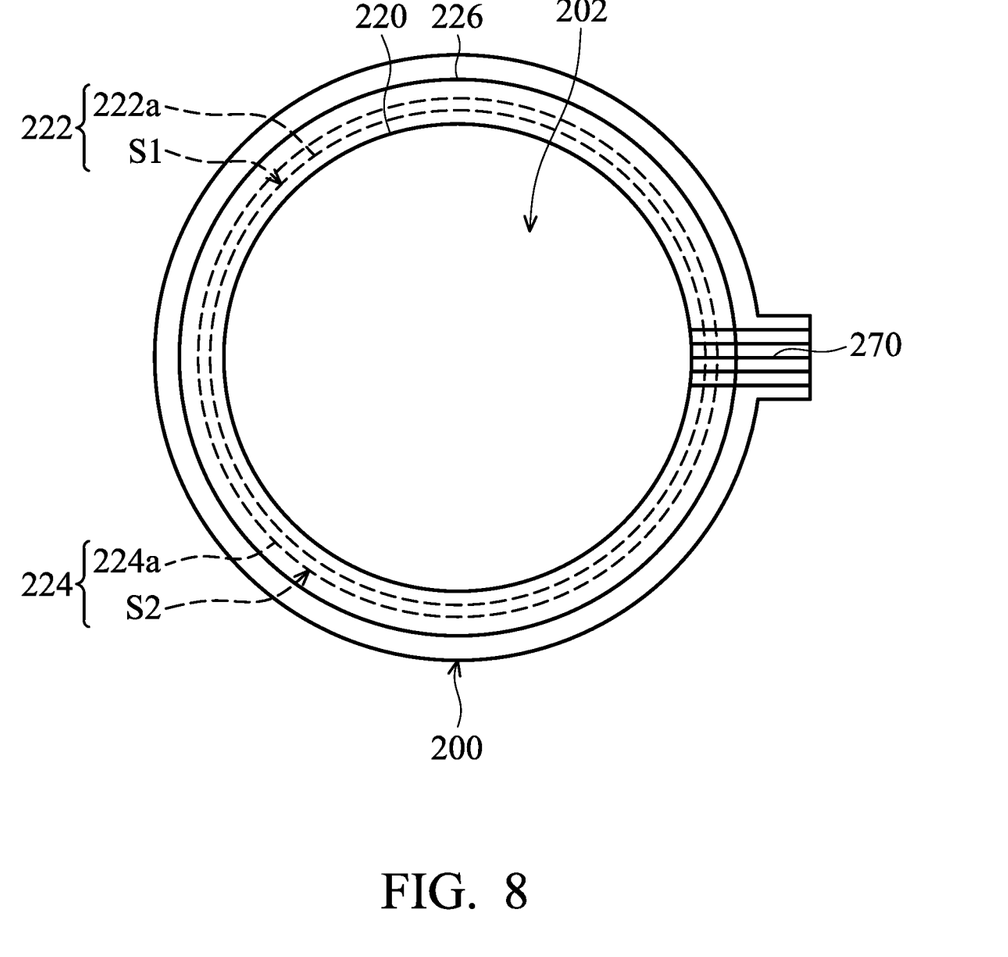
FIG. 8 is a top view of a light-emitting display panel in accordance with some other embodiments of the disclosure.

FIG. 8 illustrates a top view of the first section wall 222, the second section wall 224 and the enclosed wall 226 of an light-emitting display panel in accordance with some other embodiments of the disclosure. The organic material layers and inorganic material encapsulation layers are not shown in FIG. 8 for brevity. The first section wall 222, the second section wall 224 and the enclosed wall 226 of the light-emitting display panel may be arranged conforming to the shape of the display area 202. FIG. 8 illustrates a circular-shaped panel. Therefore, the first section wall 222, the second section wall 224 and the enclosed wall 226 are arranged as a circular-shape to conform to the circular-shape panel. More specifically, the first section wall 222 shown in FIG. 8 includes a plurality of first blocking sections 222a. The first blocking sections 222a are arranged substantially along a first direction (such as a direction of the tangent line of the circular display area 202). Also, the first blocking sections 222a are separated from each other through a first gap S1. The second section wall 224 shown in FIG. 8 includes a plurality of second blocking sections 224a. The second blocking sections 224a are arranged substantially along the first direction (such as a direction of the tangent line of the circular display area 202). Also, the second blocking sections 224a are separated from each other through a second gap S2. The first gap S1 and the second gap S2 are arranged on different straight lines, which are substantially along a second direction (such as a radial direction of the circular display area 202). The first direction is perpendicular to the second direction. In FIG.6, the first section wall 222, the second section wall 224 and the enclosed wall 226 are arranged to form a rectangular frame to conform to a rectangular panel. For example, the first section wall 222, the second section wall 224 and the enclosed wall 226 are rectangular, circular or another shape when seen from a top view. Also, the shape of the first section wall 222, the second section wall 224 and the enclosed wall 226 may be modified to the shape of the display panel. In addition, a conductive line 270 of the light-emitting display panel may be arranged over the top surface 201 of the array substrate 200. The conductive line 270 is formed extending from the display area 202 of the array substrate 200 to the peripheral area 204 of the array substrate 200. The conductive line 270 can be electrically connected to the first electrode 252 and the second electrode 264 of the light-emitting diode 240.

As shown in FIG. 1, in some embodiments, the light-emitting display panel 500a further includes a thin film encapsulation (TFE) structure disposed on a light-emitting display structure 220. The thin film encapsulation (TFE) structure is formed extending from the display area 202 to cover the peripheral area 204. Also, the top surface of the thin film encapsulation (TFE) structure is the top surface of the light-emitting display panel 500a. As shown in FIG. 1, the thin film encapsulation (TFE) structure may include a first inorganic material layer 228, which conformably covers and may be in contact with the top surfaces and the sidewalls of the light-emitting display structure 220, the first section wall 222, the second section wall 224 and the enclosed wall 226. As shown in FIG. 1, the first section wall 222, the second section wall 224 and the enclosed wall 226 are positioned between the first inorganic material layer 228 and the top surface 201 of the array substrate 200. The first section wall 222, the second section wall 224 and the enclosed wall 226 may be in contact with the top surface 201 of the array substrate 200. The first inorganic material layer 228 may be in contact with a portion of top surface 201 of the array substrate 200 in the display area 202 of the array substrate 200 and outside the light-emitting display structure 220. The first inorganic material layer 228 may be in contact with a portion of top surface 201 of the array substrate 200 in the peripheral area 204 between the first section wall 222 and/or the second section wall 224. In addition, the first inorganic material layer 228 may be in contact with the top surface 201 of the array substrate 200 in the peripheral area 204 and outside the enclosed wall 226.

In some embodiments, the first inorganic material layer 228 is formed of materials that may include silicon nitride (SiN$_x$), silicon dioxide (SiO$_2$), oxynitride (SiNO$_x$), aluminum oxide (Al$_2$O$_3$), diamond-like carbon (DLC), similar materials, or a combination thereof, but the disclosure is not limited thereto.

As shown in FIG. 1, in some embodiments, the thin film encapsulation (TFE) structure of the light-emitting display panel 500a may further include an organic material layer 230. The organic material layer 230 may cover the entire display area 202 of the array substrate 200. The organic material layer 230 may fully cover the light-emitting display structure 220, the first section wall 222 and the second section wall 224. The organic material layer 230 may fully fill a space between the light-emitting display structure 220 and the first section wall 222. Therefore, a portion of the top surface of the organic material layer 230 in the display area 202 is substantially a planar surface. The organic material layer 230 may fill a space between the first section wall 222 and the enclosed wall 226. The organic material layer 230 may not cover the top surface 226T and an outer sidewall 226S of the enclosed wall 226. In other words, the first inorganic material layer 228 on the top surface 226T and the outer sidewall 226S of the enclosed wall 226 is not covered by the organic material layer 230. The first inorganic material layer 228 may cover the entire enclosed wall 226. A portion of the first inorganic material layer 228 on the enclosed wall 226 may by exposed from the organic material layer 230. In addition, the organic material layer 230 covers and is in contact with the first inorganic material layer 228. In some embodiments shown in FIG. 1, a top surface 231 of the organic material layer 230 is the top surface of the light-emitting display panel 500a.

In some embodiments, the organic material layer 230 may be formed of materials including epoxy, polymer materials such as acrylic, or similar organic materials, but the disclosure is not limited thereto.

Please refer to FIGS. 1, 6 and 7, in some embodiments, the organic material layer 230 may fully fill the first gap S1 of the first section wall 222. Alternatively, the organic material layer 230 may fully fill the second gap S2 of the second section wall 224. The organic material layer 230 maybe not cover the entire outer sidewall of the enclosed wall 226. Therefore, the outer sidewall of the enclosed wall 226 is fully covered by the first inorganic material layer 228. The first inorganic material layer 228 can prevent moisture and oxygen of outside environment penetrating into the light-emitting display panel 500a. Also, the enclosed wall 226, which is formed of the organic materials, such as organic photoresists, may be used as a buffer layer to prevent the first inorganic material layer 228 suffering cracking or peeling when stress is applied to the outer edge of the light-emitting display panel 500a. Additionally, the first section wall 222 and the second section wall 224 may be applied in the applications of the flexible light-emitting display panel. The section wall helps to release the stress while the array substrate is deformed. In addition, the first section wall 222 and/or the second section wall 224 prevents moisture and oxygen to penetrate into the light-emitting display structure from the outside environment.

Figure 2:
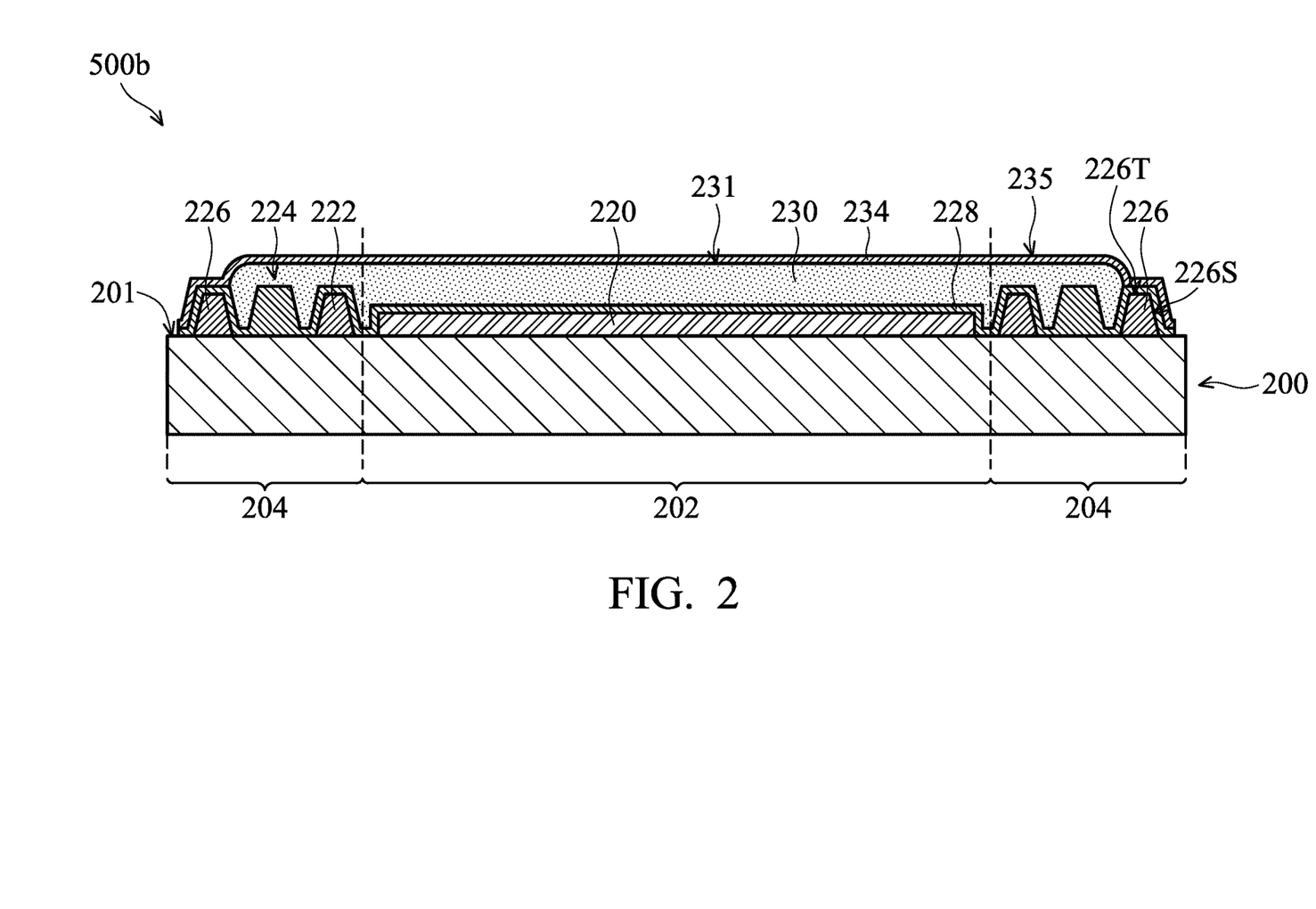
FIG. 2 is a cross-sectional view of a light-emitting display panel in accordance with some other embodiments of the disclosure.

As shown in FIG. 2, in some other embodiments, a thin film encapsulation (TFE) structure of the light-emitting display panel 500b further includes a second inorganic material layer 234. The second inorganic material layer 234 is formed extending from the display area 202 to the peripheral area 204. The second inorganic material layer 234 may fully cover the light-emitting display structure 220, the first section wall 222, the second section wall 224 and the enclosed wall 226. The second inorganic material layer 234 may fully cover the organic material layer 230 and the first inorganic material layer 228. The second inorganic material layer 234 may conformably cover and may be in contact with the organic material layer 230. In addition, the second inorganic material layer 234 may conformably cover and may be in contact with the first inorganic material layer 228 outside the enclosed wall 226. In some embodiments shown in FIG. 2, the second inorganic material layer 234 may be in contact with the first inorganic material layer 228 on the top surface and the sidewall of the enclosed wall 226. In some embodiments, the first inorganic material layer 228 and the second inorganic material layer 234 may include the same materials. In some other embodiments shown in FIG. 2, a top surface 235 of the second inorganic material layer 234 is the top surface of the light-emitting display panel 500b.

In some other embodiments shown in FIG. 2, the outer sidewall of the enclosed wall 226 of the light-emitting display panel 500b is fully covered by both the first inorganic material layer 228 and the second inorganic material layer 234. Furthermore, the first inorganic material layer 228 and the second inorganic material layer 234 may effectively prevent moisture and oxygen from penetrating into the light-emitting display panel 500a from outside the light-emitting display panel 500b (such as the exterior of the enclosed wall 226 or the top surface of the second inorganic material layer 234). Furthermore, the enclosed wall 226, which is formed of organic materials such as organic photoresists, may be used as a buffer layer for the first inorganic material layer 228 and the second inorganic material layer 234 to prevent the first inorganic material layer 228 and the second inorganic material layer 234 from cracking or peeling when stress is applied to the outer edge of the light-emitting display panel 500b.

Figure 3:
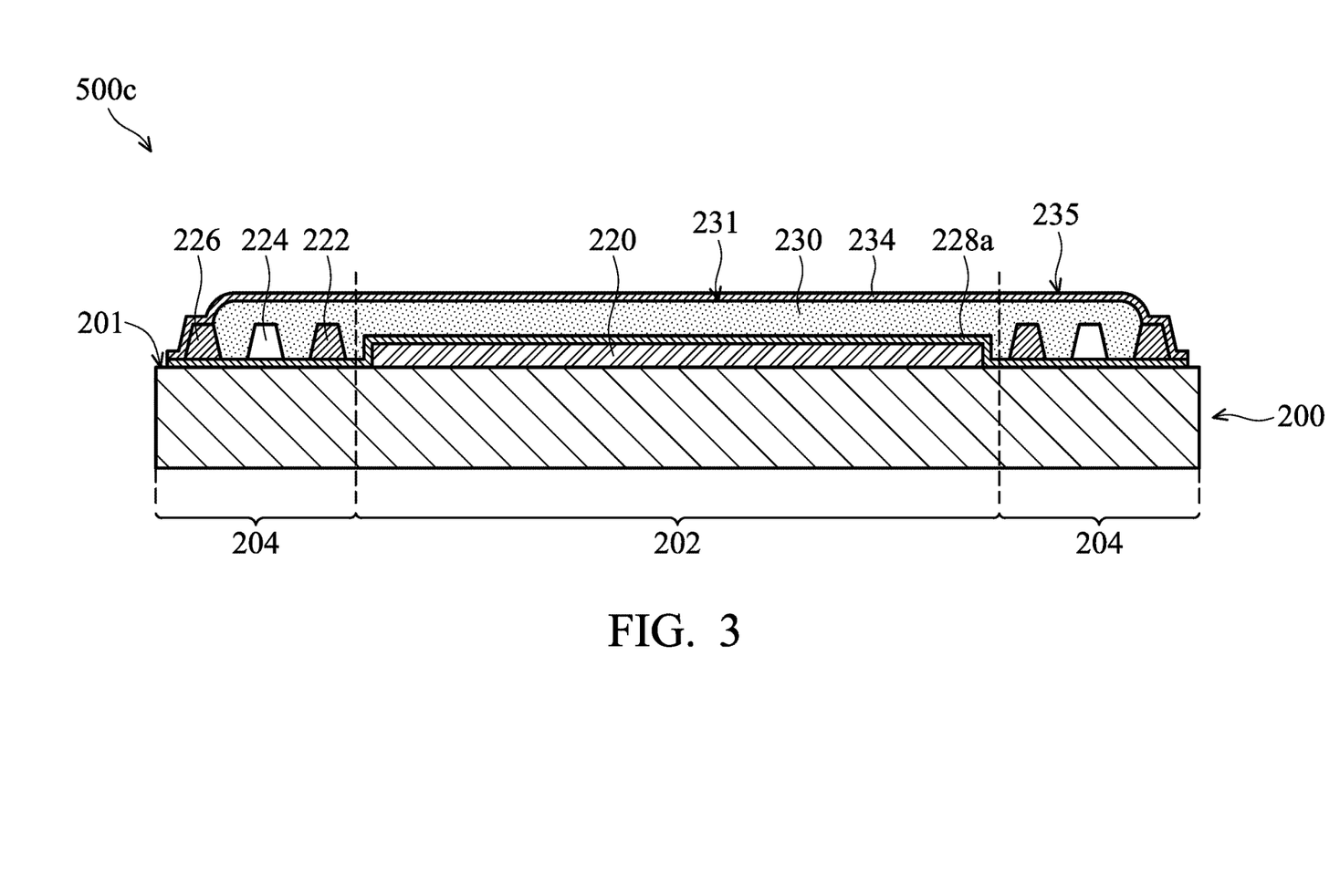
FIG. 3 a cross-sectional view of a light-emitting display panel in accordance with some other embodiments of the disclosure.

FIG. 3 illustrates a light-emitting display panel 500c in accordance with some other embodiments of the disclosure. The thin film encapsulation (TFE) structure includes the first inorganic material layer 228a, the organic material layer 230 laminated on the first inorganic material layer 228a, and the second inorganic material layer 234 laminated on the organic material layer 230. One of the differences between FIG. 3 and FIG. 2 is that the first inorganic material layer 228a is disposed in different positions. As shown in FIG. 3, the first inorganic material layer 228a may conformably cover and may be in contact with the light-emitting display structure 220. The first inorganic material layer 228a may conformably cover and may be in contact with the top surface 201 of the array substrate 200 in the display area 202 and the peripheral area 204 and outside the light-emitting display structure 220. The first section wall 222, the second section wall 224 and the enclosed wall 226 are disposed on the first inorganic material layer 228a. The enclosed wall 226 may be in contact with the organic material layer 230, the first inorganic material layer 228a and the second inorganic material layer 234. The top surface and the outer sidewall of the enclosed wall 226 may be in contact with the second inorganic material layer 234. In addition, the first section wall 222 and the second section wall 224 may be fully encapsulated by the organic material layer 230. Furthermore, the organic material layer 230 may cover and may be in contact with the top surfaces and the outer sidewalls of the first section wall 222 and the second section wall 224. The first inorganic material layer 228a may be in contact with the bottom surfaces of the first section wall 222 and the second section wall 224. In some embodiments shown in FIG. 3, the top surface 235 of the second inorganic material layer 234 is the top surface of the light-emitting display panel 500c.

In some embodiments shown in FIG. 3, the bottom surface and the outer sidewall of the enclosed wall 226 of the light-emitting display panel 500c are respectively fully covered by the second inorganic material layer 234 and the first inorganic material layer 228a. Furthermore, the first inorganic material layer 228a on the top surface 201 of the array substrate 200 in the peripheral area 204 and the exterior of the enclosed wall 226 is covered by the second inorganic material layer 234. Therefore, the first inorganic material layer 228a and the second inorganic material layer 234 may effectively prevent moisture and oxygen of outside environment penetrating into the light-emitting display panel 500a (such as the exterior of the enclosed wall 226 or the top surface of the second inorganic material layer 234). Furthermore, the enclosed wall 226, which is formed of the organic materials, such as organic photoresists, may be used as a buffer layer for the first inorganic material layer 228a and the second inorganic material layer 234 to prevent the first inorganic material layer 228a and the second inorganic material layer 234 suffering cracking or peeling when stress is applied to the outer edge of the light-emitting display panel 500c. Furthermore, the first section wall 222, the second section wall 224 and the enclosed wall 226, which are disposed on the first inorganic material layer 228a, may apply stress on the first inorganic material layer 228a to prevent the first inorganic material layer 228a suffering warping or peeling.

FIGS. 1, 4 and 5 illustrate a method for fabricating the light-emitting display panel 500a in accordance with some embodiments of the disclosure. First, an array substrate 200 shown in FIG. 4 is formed. The array substrate 200 including providing a substrate 206. Next, a barrier layer 208 is conformally on the top surface of the substrate 206 using a deposition method such as atomic layer deposition (ALD), physical deposition (PVD), chemical deposition (CVD), etc.

Next, the thin film transistor (TFT) 210 shown in FIG. 4 is formed. One or more TFTs 210 are formed on the barrier layer 208 using a deposition process (including deposition methods such as PVD, CVD, etc.), an excimer laser annealing (ELA) process and a patterning process (such as a photolithography process, an etching process, or a photoresist stripping process), but the disclosure is not limited thereto. After the aforementioned processes, the array substrate 200 is formed. In some embodiments, the TFTs 210 are positioned on the display area 202 of the array substrate 200. Each of the TFTs 210 may individually drive a sub-pixel unit.

Next, the light-emitting display structure 220, the first section wall 222, second section wall 224, and the enclosed wall 226 shown in FIG. 4 are formed. The first pixel defining layer 242, which is formed of an organic material such as an organic photoresist, may be formed on the TFTs 210 in the display area 202 of the array substrate 200 using a photolithography process including photoresist coating, photoresist exposure and photoresist development, but the disclosure is not limited thereto. A lower portion 222-1 of the first section wall 222, a lower portion 224-1 of the second section wall 224 and the enclosed wall 226, which are disposed on the top surface 201 of the array substrate 200 in the peripheral area 204, are simultaneously formed with the first pixel defining layer 242 by the photolithography process. Therefore, the first pixel defining layer 242, the lower portion 222-1 of the first section wall 222, the lower portion 224-1 of the second section wall 224 and the enclosed wall 226 are formed of the same material. The first pixel defining layer 242, the lower portion 222-1 of the first section wall 222, the lower portion 224-1 of the second section wall 224 and the enclosed wall 226 may be the same height. The first pixel defining layer 242, the lower portion 222-1 of the first section wall 222, the lower portion 224-1 of the second section wall 224 and the enclosed wall 226 may be different heights in accordance with some other embodiments of the disclosure using a half tone photolithography process. The first pixel defining layer 242 is configured to have a planarization function, and it may be also called a planarized layer.

Next, the first electrode 252 of the light-emitting diode 240 may be disposed on the top surface of the first pixel defining layer 242 using a thin film deposition process, such as evaporation, sputtering and coating, and the subsequence patterning process, but the disclosure is not limited thereto. The first electrode 252 is electrically connected to the TFT 210.

Next, the second pixel defining layer 244, which is formed of an organic material such as an organic photoresist, may be disposed on the first pixel defining layer 242 in the display area 202 of the array substrate 200 using a photolithography process including photoresist coating, photoresist exposure and photoresist development, but the disclosure is not limited thereto. In addition, the photolithography process respectively forms an upper portion 222-2 of the first section wall 222 and an upper portion 224-2 of the second section wall 224 on the lower portion 222-1 of the first section wall 222 and the lower portion 224-1 of the second section wall 224 in the peripheral area 204 of the array substrate 200. Therefore, the second pixel defining layer 244, the upper portion 222-2 of the first section wall 222 and the upper portion 224-2 of the second section wall 224 are formed of the same material and formed by the same process. Furthermore, the second pixel defining layer 244 has a plurality of openings 248 to define the positions of the sub-pixels of the light-emitting display structure 220. The positions of the opening 248 are corresponding to the position of the first electrodes 252. Moreover, the second pixel defining layer 244, the upper portion 222-2 of the first section wall 222 and the upper portion 224-2 of the second section wall 224 may be different heights using a half tone photolithography process. It should be noted that the height H1 of the first section wall 222 and/or the second section wall 224 may be greater than the height H2 of the enclosed wall 226.

Next, as shown in FIGS. 4 and 5, a light-emitting layer (EML) 258 may be formed in the opening 248 of the second pixel defining layer 244 using a thin film deposition process. For example, a hole injection layer (HIL) 254, a hole transport layer (HTL) 256, the light-emitting layer (EML) 258, an electron transport layer (ETL) 260 and an electron injection layer (EIL) 262 may be sequentially formed in the opening 248 of the second pixel defining layer 244. Next, a second electrode 264 is formed. The light-emitting diode 240 is electrically connected to the TFT 210 through the first electrode 252. The second electrode 264 of the light-emitting diode 240 may extend to cover the upper portion of the second pixel defining layer 244, or to cover the top surface 201 of the array substrate 200 (not shown). The second electrodes 264 of the different light-emitting diodes 240 may be connected to each other. A single light-emitting diode 240 of each of the openings 248 serves as a sub-pixel device. After the aforementioned processes, the light-emitting display structure 220 shown in FIG. 1 is formed.

Next, the first inorganic material layer 228 shown in FIG. 1 is formed. The first inorganic material layer 228 may be conformably formed on the top surfaces and the sidewalls of the light-emitting display structure 220, the first section wall 222, the second section wall 224 and the enclosed wall 226 using a deposition process such as atomic layer deposition (ALD), physical deposition (PVD), or chemical deposition (CVD), but the disclosure is not limited thereto.

Next, the organic material layer 230 shown in FIG. 1 is formed. A liquid organic material (not shown) is deposited on the first inorganic material layer 228 in the display area 202 using a deposition method such as one drop filling (ODF), inkjet printing (IJP), screen printing, silt coating, etc. . . . . The liquid organic material may flow from the display area 202 to the peripheral area 204. In some embodiments, the liquid organic material may be blocked by the first section wall 222. Alternatively, the liquid organic material may overflow through the gap S1 of the first section wall 222 to the second section wall 224 and may be blocked by the second section wall 224. Alternatively, the liquid organic materials may overflow through the gaps S1 of the first section wall 222, the gaps S2 of the second section wall 224 to the enclosed wall 226 and may be blocked by the enclosed wall 226. Therefore, the height of an outer edge of the liquid organic material may be lower than the height of a central portion of the liquid organic material. Next, a curing process, such as UV curing, is performed on the liquid organic materials to cure the liquid organic materials to form a rigid organic material layer 230. The organic material layer 230 is formed covering the light-emitting display structure 220 and is completely blocked by the enclosed wall 226, so that the organic material layer 230 does not cover the top surface and the outer sidewall of the enclosed wall 226. The height of the outer edge of the organic material layer 230 may be lower than the height of the central portion of the organic material layer 230. After the aforementioned processes, the light-emitting display panel 500a shown in FIG. 1 is formed.

The method for fabricating the light-emitting display panel 500b shown in FIG. 2 includes entirely and conformably forming a second inorganic material layer 234 in the display area 202 and the peripheral area 204 of the array substrate 200 using a deposition process such as atomic layer deposition (ALD), physical deposition (PVD), or chemical deposition (CVD) after forming the organic material layer 230, but the disclosure is not limited thereto. The second inorganic material layer 234 covers and is in contact with the organic material layer 230. Furthermore, the second inorganic material layer 234 covers and is in contact with the first inorganic material layer 228 exposed from the organic material layer 230. The second inorganic material layer 234 covers and is in contact with the first inorganic material layer 228 on a top surface 226T and an outer sidewall 226S of the enclosed wall 226. After the aforementioned processes, the light-emitting display panel 500b shown in FIG. 2 is formed.

The method for fabricating the light-emitting display panel 500c shown in FIG. 3 includes forming the walls of the light-emitting display panel of the light-emitting display structure in different processes. As shown in FIG. 3, after the thin film transistor of the array substrate 200 (such as the TFT 210 shown in FIG. 4) is formed, the light-emitting display structure 220 is formed. The process of the light-emitting display structure 220 may refer to the aforementioned description.

As shown in FIG. 3, after the light-emitting display structure 220 is formed, the first inorganic material layer 228a is subsequently formed. The first inorganic material layer 228a is conformably formed on the top surface of the light-emitting display structure 220 using a deposition process, such as atomic layer deposition (ALD), physical deposition (PVD), or chemical deposition (CVD), but the disclosure is not limited thereto. Therefore, the first inorganic material layer 228a is in contact with the top surface 201 of the array substrate 200 outside the light-emitting display structure 220.

As shown in FIG. 3, the first section wall 222, the second section wall 224 and the enclosed wall 226 are disposed on the first inorganic material layer 228a in the peripheral area 204 after forming the first inorganic material layer 228a. A liquid or a sticky organic material may be formed directly on the top surface 201 of the array substrate 200 outside the light-emitting display structure 220 using inkjet printing (IJP), dispensing, etc. . . . . The liquid or a sticky organic material may be formed in the desired shape to correspond to the shapes of the subsequent first section wall 222, the second section wall 224 and the enclosed wall 226. Next, a curing process, such as UV curing, is performed on the liquid or a sticky organic material to form the first section wall 222, the second section wall 224 and the enclosed wall 226 of the light-emitting display panel 500c.

As shown in FIG. 3, after the first section wall 222, the second section wall 224 and the enclosed wall 226 are formed, the organic material layer 230 and the second inorganic material layer 234 may be sequentially formed using the processes shown in FIGS. 1 and 2. After the aforementioned processes, the light-emitting display panel 500c shown in FIG. 3 is formed.

In some embodiments, the section wall disposed on the peripheral area can block the organic material layer and prevent the organic material layer from overflowing to the undesired region outside the enclosed wall. Therefore, the enclosed wall may be formed at a height that is lower than the height of the section wall. Furthermore, the section wall can increase the bending ability of the panel. Therefore, the light-emitting display panel in accordance with some embodiments of the disclosure may be applicable to flexible panels.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A light-emitting display panel, comprising:
  a substrate comprising a display area and a peripheral area outside the display area;
  a light-emitting display structure disposed on the display area;
  an enclosed wall disposed on the peripheral area and between the display area and an edge of the substrate; and
  a first wall disposed on the peripheral area and between the edge of the substrate and the display area, wherein in a top view, the enclosed wall has an edge and at least part of the edge is curved, and
  wherein an organic material layer fills a space between the first wall and the enclosed wall.
2. The light-emitting display panel according to claim 1, wherein the first wall is surrounded by the enclosed wall.
3. The light-emitting display panel according to claim 2, wherein in a top view, the first wall has an edge and at least part of the first wall is curved.

4. The light-emitting display panel according to claim 1, further comprising a conductive line disposed over the substrate, wherein the conductive line overlaps the enclosed wall.

5. The light-emitting display panel according to claim 4, wherein the enclosed wall crosses the conductive line.

6. The light-emitting display panel according to claim 5, wherein the enclosed wall and the first wall crosses the conductive line.

7. The light-emitting display panel according to claim 5, wherein the conductive line extends from the display area to the peripheral area.

8. The light-emitting display panel according to claim 5, wherein the conductive line extends out of the enclosed wall.

9. The light-emitting display panel according to claim 8, wherein the conductive line extends to an edge of the substrate.

10. The light-emitting display panel according to claim 4, wherein the light-emitting display structure comprises a light-emitting diode, and the conductive line is electrically connected to the light-emitting diode.

11. The light-emitting display panel according to claim 1, wherein the first wall is sectional.

* * * * *